United States Patent [19]

Okayasu

[11] Patent Number: 4,930,570
[45] Date of Patent: Jun. 5, 1990

[54] ELECTRONIC EQUIPMENT COOLING DEVICE

[76] Inventor: Kenji Okayasu, 20-15, Mukai-machi, Gyoda-shi, Saitama-ken, 361, Japan

[21] Appl. No.: 288,764

[22] Filed: Dec. 22, 1988

[30] Foreign Application Priority Data

Dec. 22, 1987 [JP] Japan .................... 62-324820

[51] Int. Cl.$^5$ ............................. F28D 15/02
[52] U.S. Cl. ................ 165/104.14; 165/104.22; 165/104.29; 165/104.25; 361/385; 417/209
[58] Field of Search ............ 165/104.29, 104.22, 165/104.14, 104.25; 417/209, 208, 207; 361/385

[56] References Cited

U.S. PATENT DOCUMENTS

| 2,954,741 | 10/1960 | Kleen | 417/209 |
| 3,929,305 | 12/1975 | Sabol | 165/104.29 |
| 4,120,172 | 10/1978 | Pierce | 62/119 |
| 4,212,593 | 7/1980 | Chadwick | 417/209 |
| 4,416,587 | 11/1983 | Trihey | 417/209 |
| 4,418,547 | 12/1983 | Clark, Jr. | 165/104.22 |
| 4,450,690 | 5/1984 | Clark, Jr. | 165/104.22 |
| 4,625,790 | 12/1986 | Okayasu | 165/104.29 |
| 4,792,283 | 12/1988 | Okayasu | 417/209 |

FOREIGN PATENT DOCUMENTS

| 31679 | 2/1986 | Japan . |
| 122170 | 8/1987 | Japan . |
| 122171 | 8/1987 | Japan . |
| 897785 | 5/1962 | United Kingdom . |

Primary Examiner—Albert W. Davis, Jr.
Attorney, Agent, or Firm—Cushman, Darby & Cushman

[57] ABSTRACT

An electronic equipment cooling device having: a first cyclic flow passage which includes the equipments to be cooled, a radiator or a cooling exchanger, and two stopper valves for making the direction of flow one way, and a second cyclic flow passage which includes a heat drive pump driven by heat from heating devices in the equipments and a radiator or a cooling exchanger for cooling the heat drive pump, wherein the two cyclic flow passages are connected to each other with a pressure conducting device.

1 Claim, 4 Drawing Sheets

ELECTRONIC EQUIPMENT COOLING DEVICE

BACKGROUND OF THE INVENTION

1. Field of the Invention

The present invention relates to a cooling device for electronic equipments for use in aircraft or high speed computers displaying a high mounting density and involving a necessity for its size to be reduced.

2. Description of the Prior Art

Hitherto, there has been a problem to be overcome upon removal of heat generated by electronic equipment since the size of the electronic equipment needs to be reduced and operation speed thereof needs to be increased. In order to overcome such problems, liquid has been cycled in the equipment so as to transmit generated heat outside the equipment for the purpose of allowing the heat to radiate.

However, a liquid cooling device of the type described above needs to be provided with a liquid cycling pump and a motor for driving the pump and an electricity. Therefore, such type of device cannot be small in size, and furthermore, it cannot be preferably used from the viewpoints of reliability, electricity consumption and noise reduction.

SUMMARY OF THE INVENTION

An object of the present invention is to provide a cooling device capable of overcoming the above-described problems and can be used in a small sized device.

In order to overcome the above-described object, an electronic equipment cooling device according to the present invention includes: a cyclic flow passage which includes the equipment to be cooled, a radiator or a cooling exchanger, and two stopper valves for making the direction of flow one way: and a cyclic flow which includes a heat drive pump driven by heat from heating devices in the equipment and a radiator or a cooling exchanger for cooling the heat drive pump, wherein the two cyclic flow passages are connected to each other with a pressure conducting device.

DESCRIPTION OF THE PREFERRED EMBODIMENT

Figure 1:
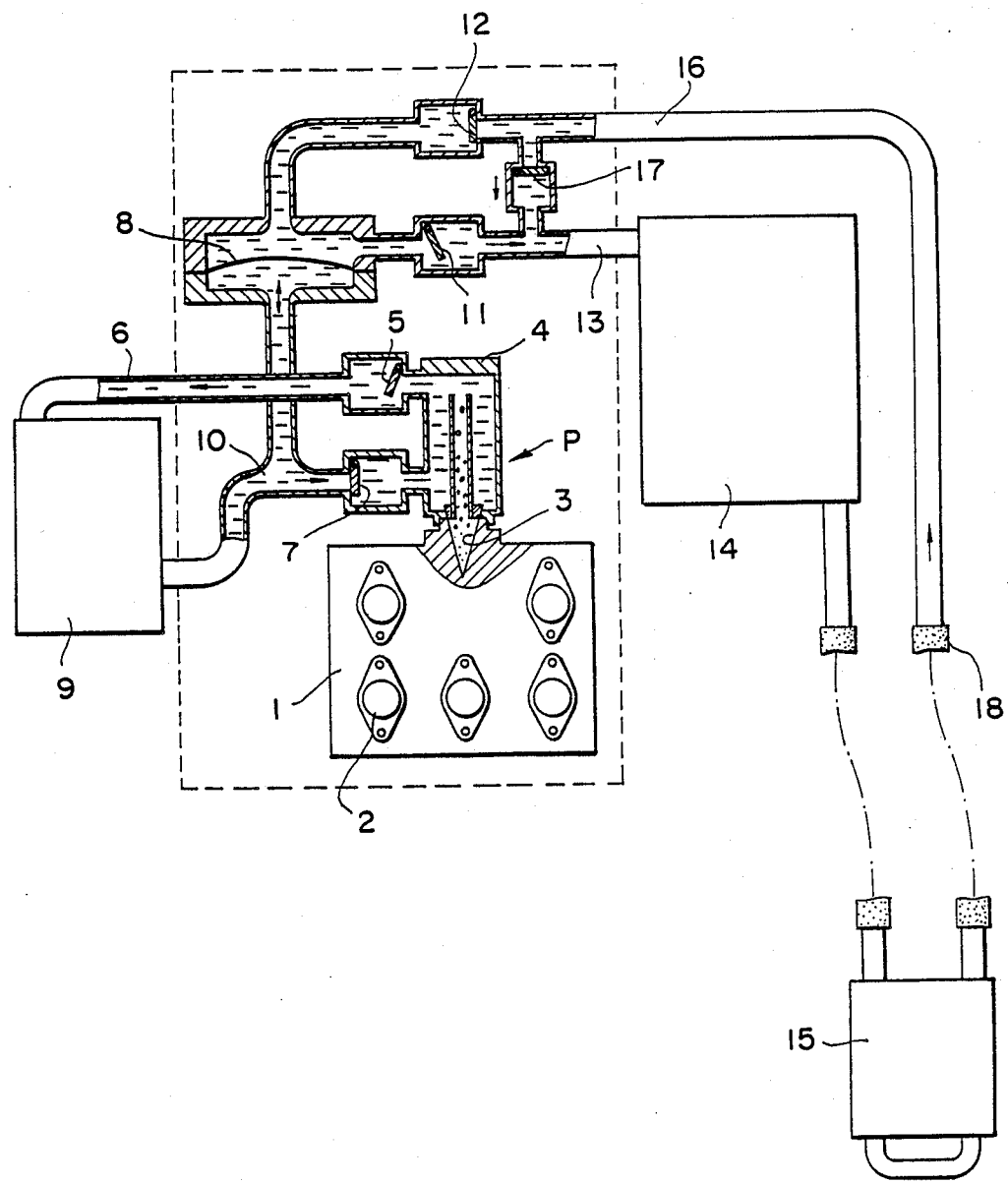
FIG. 1 is an overall view of an electronic equipment cooling device according to the present invention, in which a partial portion is shown as a cross-sectional shape.

FIG. 1 illustrates a cooling device according to an embodiment of the present invention. Five power transistors insulated by an electricity insulating sheet and arranged to serve as an electric power source are secured to a heat accumulating plate 1 made of a material having a high heat conductivity such as copper. The upper portion of the heat accumulating plate 1 also serves as a recessed portion 3 for a heating portion of the heat drive pump P. Heat from the power transistors 3 is accumulated by the heat accumulating plate 1 to the recessed portion 3 in which a part of the inner liquid is vaporized. As a result, steam bubbles are generated and grown in a gas-liquid converting chamber 4. As a result of the thus-grown steam bubbles, liquid in the gas-liquid converting chamber 4 opens a primary discharge stopper valve 5 by a degree corresponding to the grown capacity of the steam bubbles, and the liquid is discharged into a primary outlet pipe 6. At this time, a primary suction stopper valve 7 is closed so that the liquid corresponding to the grown capacity of the steam bubbles makes a diaphragm of a pressure conducting device 8 project upward. When the grown steam bubbles then disappear due to being cooled in the gas-liquid converting chamber 4, the primary discharge stopper valve 5 is closed, while the primary suction stopper valve is opened so that the liquid which has been cooled by a first radiator 9 is, via a primary inlet pipe 10, introduced into the gas-liquid converting chamber 4 of the heat drive pump P. Simultaneously, the diaphragm which has projected upward restores its original state. As described above, liquid in the primary cyclic flow passage including the heat drive pump P cycles through the flow passage with heat generated by the power transistors 3 transferred to the outside primary radiator 9, and moves the diaphragm of the pressure conducting device 8. On the other hand, since the diaphragm 8 projects upward, inner liquid opens a secondary discharge stopper valve 11 and closes the secondary suction stopper valve 12 in the secondary cyclic flow passage so that liquid is pushed out by the amount corresponding to the capacity of the diaphragm projected from the secondary outlet pipe 13 to the secondary radiator 14. When the diaphragm of the pressure conducting device is returned to its original state, liquid returns from a heat accumulating portion 15 in the electronic equipment after it has passed the connecting rubber tube 18 and a secondary inlet pipe 16 and closed the secondary suction stopper valve 12. As described above, heat in the electronic equipment is transferred by the liquid in the secondary cyclic flow passage and radiates to outside. A water hammer prevention stopper valve 17 disposed outside the two stopper valves in the secondary cyclic flow passage and in parallel to the heat accumulating portion 15 in the electronic equipment serves to absorb the water hammer generated when the stopper valves are opened and closed. Such water hammer prevention stopper valve can effectively prevent the water hammer in a case of a long cyclic flow passage. The water hammer prevention stopper valve may be provided in the primary cyclic flow passage side including the heat drive pump. However, this cooling device can operate if such water hammer is not provided.

In a case where the cyclic flow passage comprises pipes made of metal or the like, an accumulator needs to be provided in the secondary cyclic flow passage. Such accumulator can be replaced by a rubber or a soft plastic pipe used in part in the flow passage. Furthermore, since different types of liquid can be used between the primary flow passage and the secondary flow passage, use of easily vaporizable liquid, with respect to liquid used in the secondary flow passage, in a primary flow passage can cause the diaphragm to operate further actively.

Figure 2:
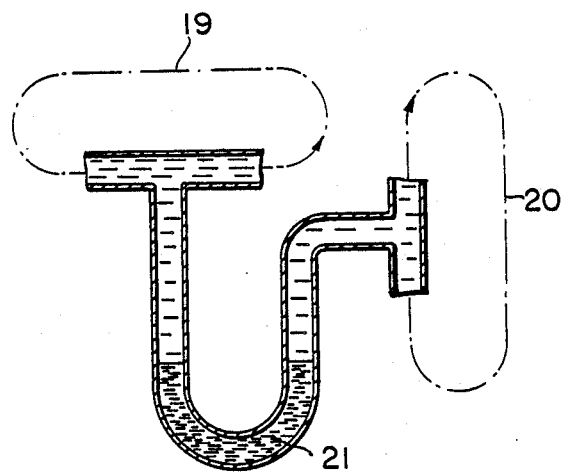
FIG. 2 is a cross-sectional view of another means for connecting two flow passages from the viewpoint of operation.

Furthermore, even if the power consumption by the electronic equipment is changed when the same is used, the following changes automatically occur in accordance with this power consumption change by virtue of the characteristics of such heat drive pump: increase in the power consumption, increase in heat generated from the power transistors, increase in the amount of discharge from the heat drive pump, and increase in the amount of circulating liquid in the secondary flow passage in the electronic equipment. As a result, temperature rise in the electronic equipment can be prevented. Referring to FIG. 2, the region surrounded by dashed line serves as a driving portion of the device according to the present invention.

The flow passage which connects the primary flow passage to the diaphragm may be disposed any position in the primary flow passage. However, it is preferable for this flow passage to be disposed between the outlet of the primary side radiator and the primary side suction stopper valve in order to make heat transmission from the heat drive pump to the diaphragm difficult.

The secondary radiator in the secondary flow passage may also be disposed in the secondary flow passage. However, it is advantageous for the secondary radiator to be disposed between the secondary suction stopper valve which is disposed at the outlet from the diaphragm and the heat accumulating portion in the electronic equipment on the viewpoint that cooled liquid from the outlet of the radiator can be supplied to the inside portion of the electronic equipment.

Figure 3:
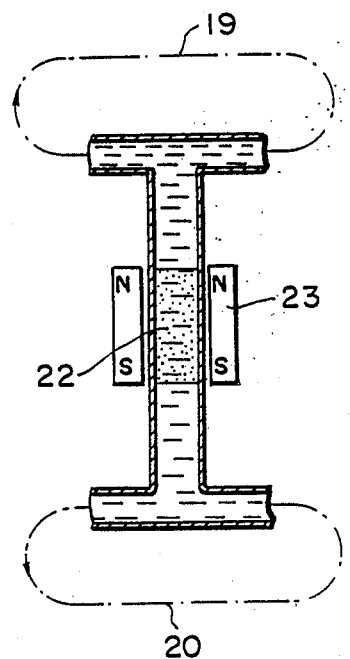
FIG. 3 is a view similar to FIG. 2 illustrating other means.

Although the primary cyclic flow passage and the secondary cyclic flow passage are connected to each other with a diaphragm in the embodiment shown in FIG. 1, another structure may be employed as an alternative to the structure in which the diaphragm is employed. That is, as shown in FIG. 2, a U-shaped pipe is used to establish a connection between the primary cyclic flow passage 19 and the secondary cyclic flow passage 20 and liquid 21 having a larger density than that used in the primary side and the secondary side and having a characteristic not to be mixed with the liquid in both sides is enclosed in this above-described U-shaped pipe. In addition, a structure as shown in FIG. 3 may be employed such that magnetic liquid 22 is enclosed between the liquid in the primary side and the secondary side and the thus-enclosed magnetic liquid is retained at a predetermined position by a permanent magnet 23.

Figure 4:
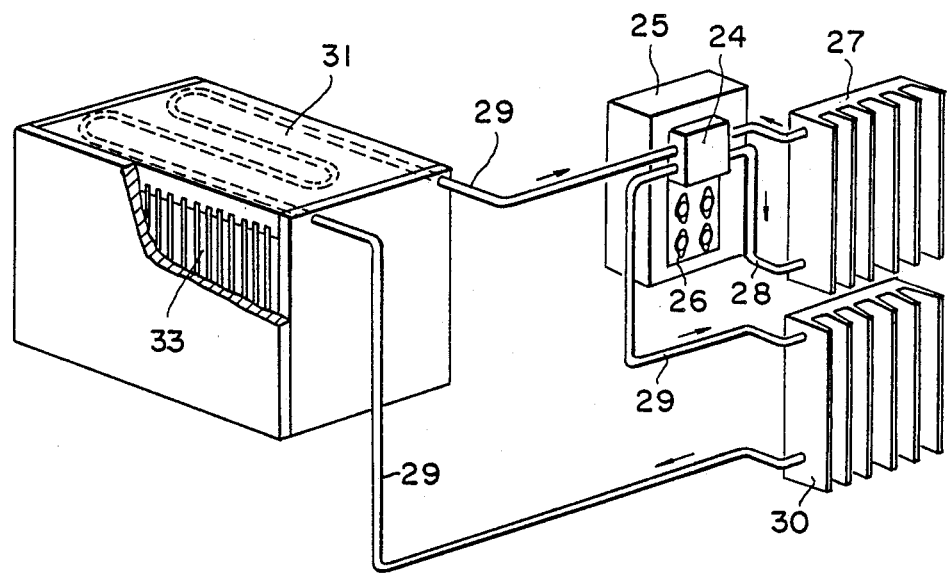
FIG. 4 is a perspective view, a part of which is cut, of an electronic equipment cooling device according to another embodiment of the present invention.

FIG. 4 is a perspective view of another embodiment of the present invention and illustrates the device according to the present invention is applied to actual equipment. A heat source and a primary radiation system are formed by a driving portion 24 which comprises the heat drive pump, electric power source unit 25 and power transistors 26 serving as a heat source, primary radiator 27 and a primary cyclic flow passage pipe 28.

On the other hand, a secondary radiation system is formed by a secondary cyclic flow passage pipe 29 which passes from the secondary radiator 30, via heat accumulating portion 31 in the electronic equipment, to a driving portion.

Figure 5:
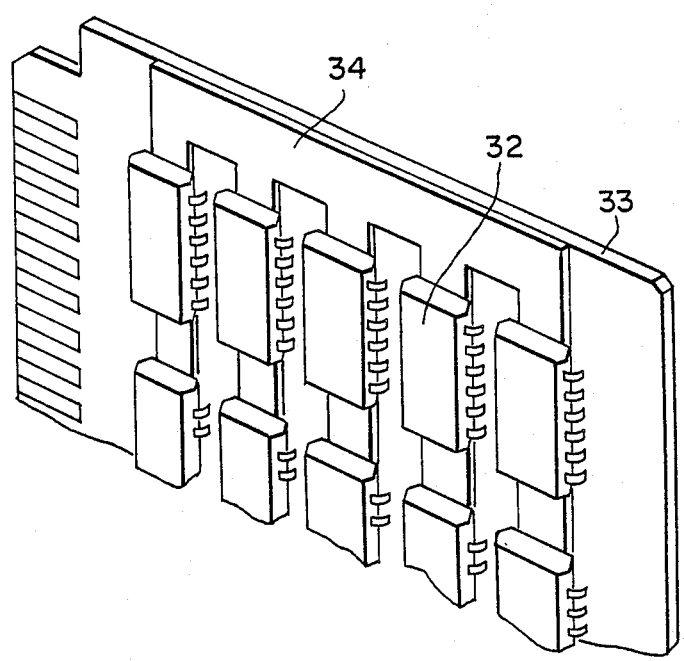
FIG. 5 is a partial perspective view of a print including electronic devices and a substrate.

A multiplicity of printed substrates 33 as shown in FIG. 5 are provided in the electronic equipment in such a manner that the printed substrates 33 are coupled with the heat accumulating portion 31.

FIG. 5 illustrates the printed substrates 33 manufactured so as to be used in a high-density mounted manner. Each of the electronic devices 32 is soldered in such a manner that the same is positioned in contact with a bus bar 34 made of a material having an excellent thermal conductivity such as copper. As a result, heat generated from each of the electronic devices is transmitted to the bus bar 34.

Figure 6:
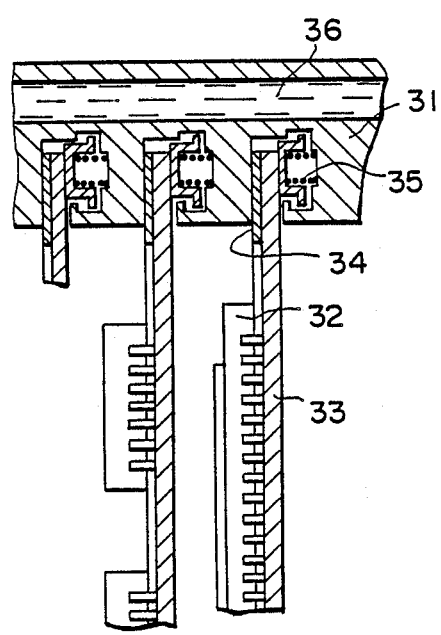
FIG. 6 is a partial cross-sectional view illustrating a state in which printed substrates are mounted on a heat accumulating portion in an electronic equipment.

FIG. 6 is a cross-sectional view of the guide portion of the printed substrate shown in FIG. 4. The printed substrate 33 is abutted by a spring 35 against the bus bar 34 on the wall of the guide portion which is made of an excellent heat conductive material in the heat accumulating portion 31 in the electronic equipment. As a result, heat can be transmitted to the heat accumulating portion 31. Since a cyclic flow passage 36 is provided in this heat accumulating portion 31, heat of the heat accumulating portion 31 is discharged by cyclic liquid enclosed in the cyclic flow passage 36.

The cooling device according to the present invention does not need any additional energy source such as electricity since it is operated by heat generated from heating devices in an electric source or the like. Furthermore, since the device according to the present invention does not employ a conducting motor, noise cannot be generated. In addition, since the size of this device can be reduced and structure of the same can be simplified, excellent reliability can be obtained and application to small sized electronic equipments can be easily performed.

What is claimed is:

1. An electronic equipment cooling device comprising:
    a first cyclic flow passage which includes equipment to be cooled, a radiator or a cooling exchanger, and two stopper valves for making the direction of flow one way; and
    a second cyclic flow passage which includes a heat drive pump driven by heat from heating devices in the equipment and a radiator or a cooling exchanger for cooling said heat drive pump,
    said two cyclic flow passages being connected to each other with a pressure conducting device.

* * * * *